United States Patent
Lin et al.

(10) Patent No.: US 8,884,526 B2
(45) Date of Patent: Nov. 11, 2014

(54) COHERENT MULTIPLE SIDE ELECTROMAGNETS

(75) Inventors: Bo-Hung Lin, Kaohsiung (TW);
Ming-Chih Tsai, Hsinchu (TW);
Chia-Ho Chen, Zhubei (TW);
Chung-En Kao, Toufen Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 31 days.

(21) Appl. No.: 13/354,604

(22) Filed: Jan. 20, 2012

(65) Prior Publication Data

US 2013/0187546 A1  Jul. 25, 2013

(51) Int. Cl.
*H01J 7/24* (2006.01)

(52) U.S. Cl.
USPC ............ 315/111.41; 315/111.21; 315/111.51; 216/66; 216/67; 216/70; 118/723 R

(58) Field of Classification Search
CPC ....................................................... H05H 1/46
USPC .............. 315/111.41; 204/192.12; 118/723 R
See application file for complete search history.

(56) References Cited

U.S. PATENT DOCUMENTS

| | | | | |
|---|---|---|---|---|
| 5,200,595 A | * | 4/1993 | Boulos et al. | 219/121.52 |
| 5,397,962 A | * | 3/1995 | Moslehi | 315/111.51 |
| 5,430,355 A | * | 7/1995 | Paranjpe | 315/111.21 |
| 6,156,171 A | * | 12/2000 | Hollars et al. | 204/298.25 |
| 7,704,886 B2 | * | 4/2010 | Su et al. | 438/692 |
| 7,846,310 B2 | * | 12/2010 | Gillard et al. | 204/298.16 |
| 7,922,880 B1 | * | 4/2011 | Pradhan et al. | 204/298.06 |
| 8,475,672 B2 | * | 7/2013 | Iori et al. | 216/66 |
| 2004/0168771 A1 | | 9/2004 | Mitrovic | |
| 2008/0277063 A1 | | 11/2008 | Shin | |
| 2011/0233050 A1 | | 9/2011 | Leeser et al. | |
| 2012/0119861 A1 | * | 5/2012 | Tang et al. | 335/306 |
| 2013/0032476 A1 | * | 2/2013 | Crowley et al. | 204/298.12 |

FOREIGN PATENT DOCUMENTS

JP   2009224455 A   10/2009
WO   2003025971 A2   3/2003

* cited by examiner

*Primary Examiner* — Douglas W Owens
*Assistant Examiner* — Srinivas Sathiraju
(74) *Attorney, Agent, or Firm* — Eschweiler & Associates, LLC

(57) ABSTRACT

In some embodiments, the present disclosure relates to a plasma processing system that generates a magnetic field having a maximum strength that is independent of workpiece size. The plasma processing system has a plurality of side electromagnets that have a size which is independent of the workpiece size. The side electromagnets are located around a perimeter of a processing chamber configured to house a semiconductor workpiece. When a current is provided to the side electromagnets, separate magnetic fields emanate from separate positions around the workpiece. The separate magnetic fields contribute to the formation of an overall magnetic field that controls the distribution of plasma within the processing chamber. Because the size of the plurality of separate side magnets is independent of the workpiece size, the plurality of side magnets can generate a magnetic field having a maximum field strength that is independent of workpiece size.

17 Claims, 7 Drawing Sheets

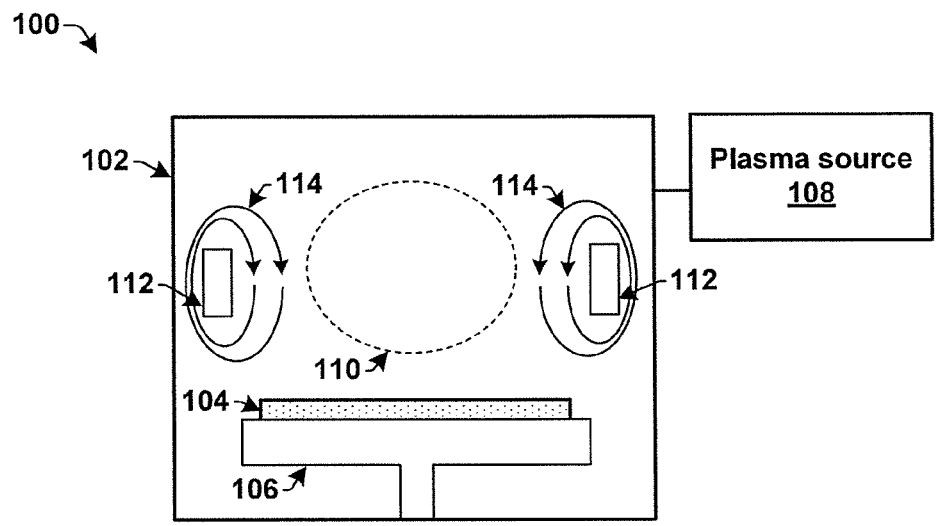
Fig. 1a
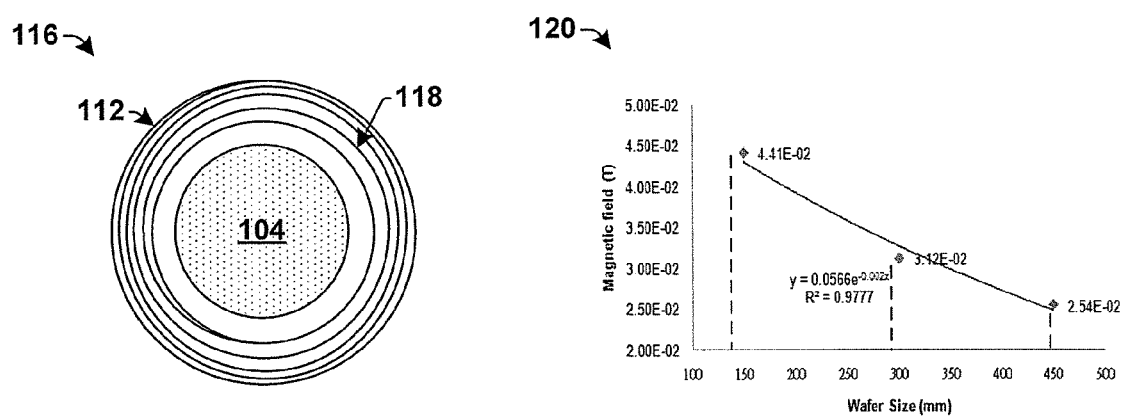
Fig. 1b
Fig. 1c

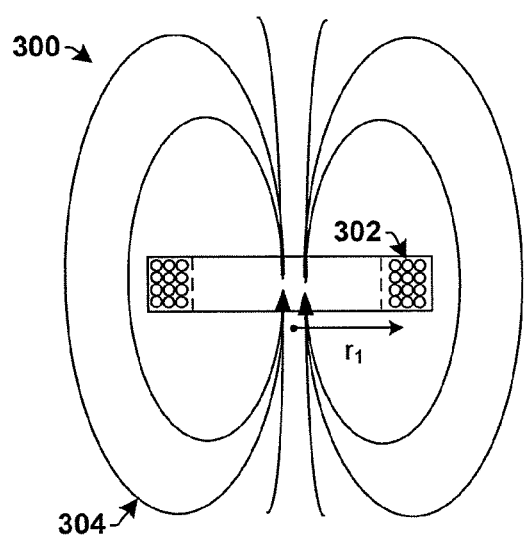
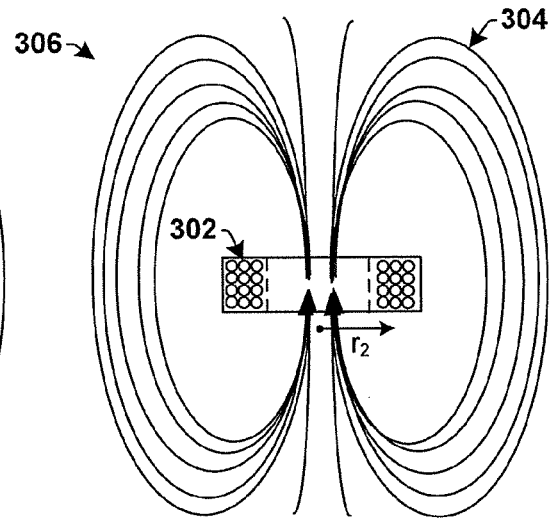
Fig. 3a　　　　Fig. 3b
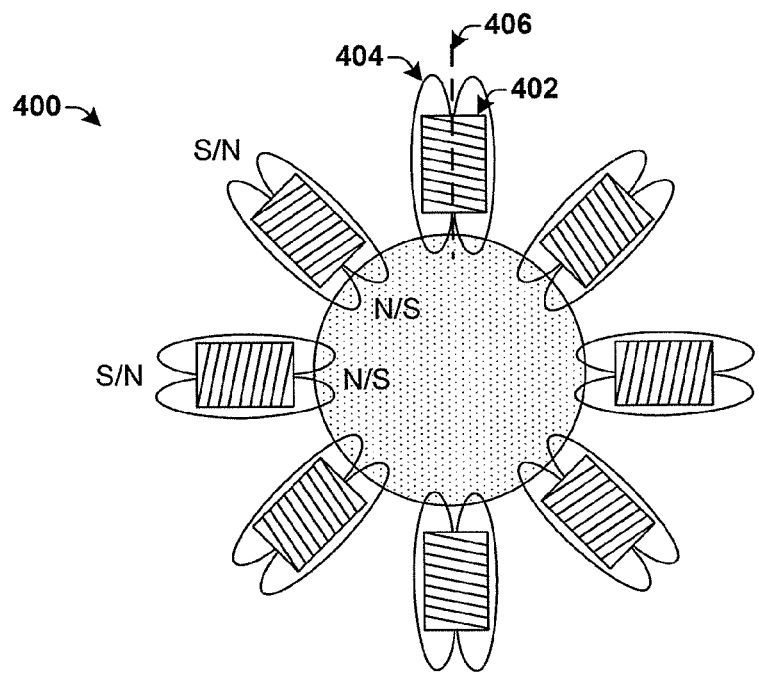
Fig. 4a

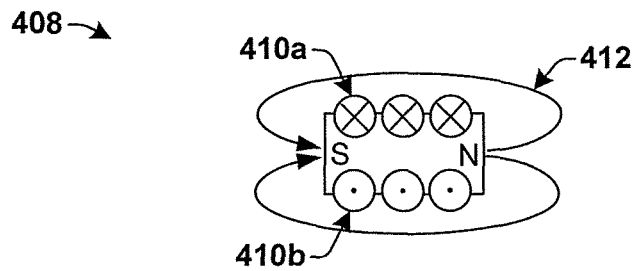
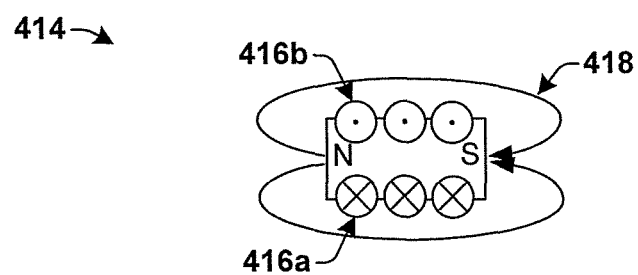
Fig. 4b
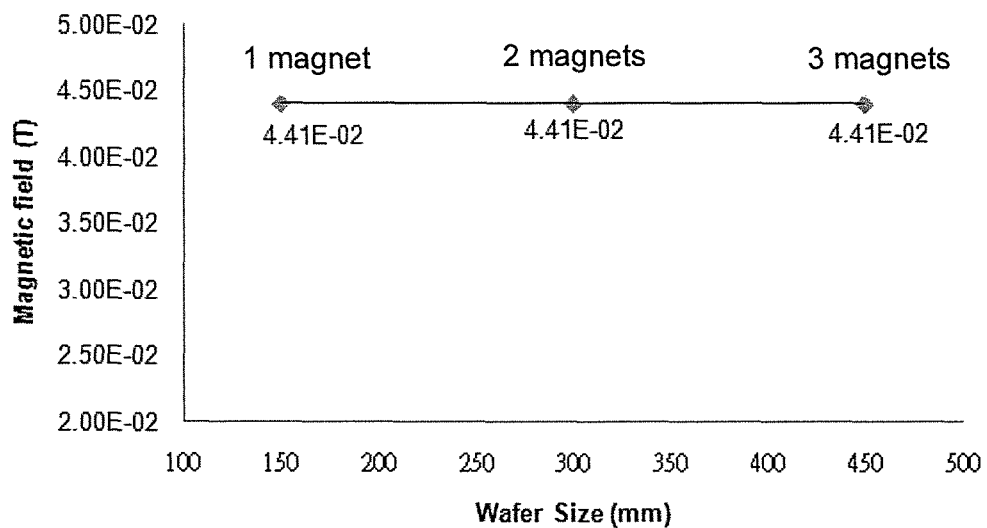
Fig. 4c

COHERENT MULTIPLE SIDE ELECTROMAGNETS

BACKGROUND

Integrated chips are formed by complex fabrication processes, during which a semiconductor workpiece is subjected to different processing steps to form one or more semiconductor devices. Some of the processing steps are performed utilizing a plasma comprising a plurality of high energy ions. Plasmas are formed within a low pressure processing chamber, and are often used for etching a semiconductor workpiece, or for depositing a thin film onto a semiconductor workpiece (e.g., using PVD or CVD), for example.

BRIEF DESCRIPTION OF THE DRAWINGS

FIG. 1a illustrates a cross-sectional view of a plasma processing system.

FIG. 1b illustrates a top view of a ring type side electromagnet of the plasma processing system of FIG. 1a.

FIG. 1c illustrates a graph of the magnetic field strength generated by a ring type side electromagnet as a function workpiece size.

FIGS. 3a-3b illustrate magnetic fields generated by electromagnetic coils having various radii.

FIG. 4a illustrates a top view of some embodiments of an array of side electromagnets having a first exemplary orientation relative to the workpiece.

FIG. 4b illustrates a direction of magnetic field lines generated by one of the disclosed side electromagnets.

FIG. 4c illustrates a graph of the magnetic field strength generated by the array of side electromagnets in FIG. 4a as a function workpiece size.

FIG. 7b illustrates a side view of a trajectory of a charged particle in a magnetic field formed according to the array of side electromagnets in FIG. 7a.

DETAILED DESCRIPTION

Figure 2A:
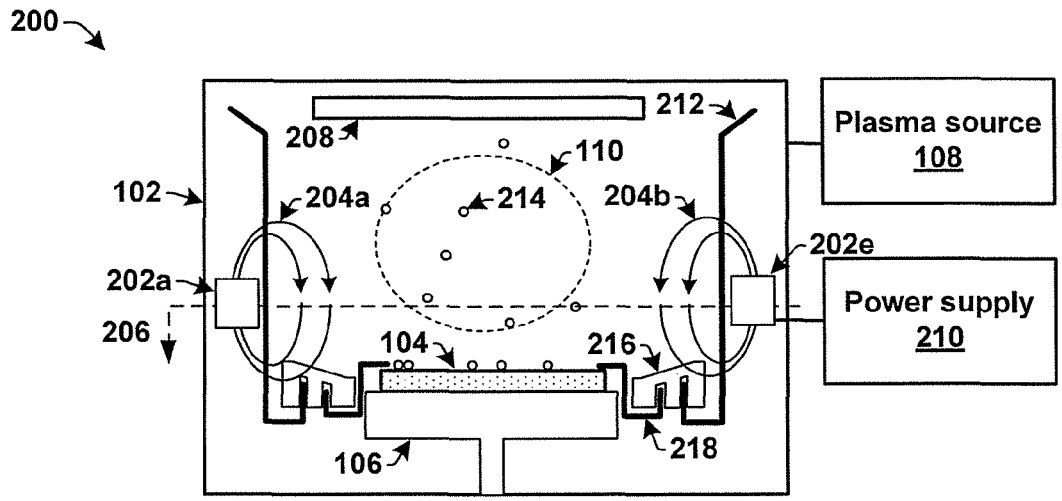
FIG. 2a illustrates a cross-sectional view of some embodiments of a plasma processing system having a plurality of side electromagnets positioned around a workpiece.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1a illustrates a cross-sectional view of a plasma processing system 100 configured to house a semiconductor workpiece 104. The plasma processing system 100 comprises a processing chamber 102 having a workpiece support structure 106 configured to hold a semiconductor workpiece 104. The workpiece support structure 106 may comprise a wafer chuck or a pedestal, for example. A plasma source 108 is configured to provide a plasma 110 to the processing chamber 102. The plasma source may comprise an upstream plasma source located external to the processing chamber 102 or a plasma source located within the processing chamber 102.

A ring type side electromagnet 112 is located along the outer edges of the processing chamber at a position that is vertically above the workpiece 104. The ring type side electromagnet 112 is configured to generate a magnetic field 114 within a processing chamber 102. The magnetic field operates upon ions within the plasma 110 to change the distribution of the plasma 110.

FIG. 1b illustrates a top view 116 of the ring type side electromagnet 112. The ring type side electromagnet 112 extends around the outer perimeter of the workpiece 104. The ring type side electromagnet 112 comprises a coil having a plurality of turns of a conductive wire 118. When current is provided to the conductive wire 118, a magnetic field 114 is formed within the processing chamber 102, as shown in FIG. 1a.

Because the ring type side electromagnet 112 extends around the outer perimeter of the workpiece 104, its size is proportional to the size of the workpiece 104. For smaller workpieces, such as for example, wafers having a diameter of less than 300 mm, this was not a problem. However, as workpiece sizes have increased to 300 mm or 450 mm, longer lengths of the conductive wire 118 are used to form the ring type side electromagnet 112. Since the resistance of a conductive wire increases with the length of the conductive wire, the power used to achieve the same maximum magnetic field strength increases as workpiece size increases (since magnetic field strength is proportional to current in the side electromagnet). However, the power that can be practically dissipated through a conductive wire is limited, since power is largely dissipated as thermal energy, which causes burn out of the conductive wire 118.

Without increasing the power provided to the conductive wire 118 the maximum magnetic field strength rapidly degrades as the size of a workpiece 104 increases. For example, FIG. 1c illustrates a graph 120 of maximum magnetic field strength produced by a ring type side electromagnet (y-axis) as a function of workpiece size (x-axis). As shown in graph 120, the maximum magnetic field strength decreases as the workpiece size increases. For example, a conventional ring type side electromagnet is able to produce a maximum magnetic field strength of $4.41 \times 10^{-2}$ T for a 150 mm workpiece. However, due to the increased conductive wire length, the maximum magnetic field strength for a 300 mm workpiece decreases to $3.12 \times 10^{-2}$ T. For 450 mm workpieces the maximum magnetic field further decreases to $2.54 \times 10^{-2}$ T.

Accordingly, the present disclosure relates to a plasma processing system having a plurality of side electromagnets configured to generate a magnetic field having a maximum magnetic field strength that is independent of workpiece size. In some embodiments, the plasma processing system comprises a processing chamber configured to house a semiconductor workpiece. A plurality of side electromagnets, having a size that is independent of a size of the workpiece, are located around a perimeter of the processing chamber. When current is provided to the side electromagnets, separate magnetic fields are generated by each side electromagnet. The separate magnetic fields emanate from different positions around the workpiece and control the distribution of plasma within the processing chamber. Because the size of the plurality of separate side electromagnets is independent of the workpiece size, the plurality of side magnets can generate a magnetic field having a maximum field strength that is independent of workpiece size.

FIG. 2a illustrates a cross-sectional view of a plasma processing system 200 having a plurality of side electromagnets 202. It will be appreciated that although plasma processing system 200 is illustrated as having certain components specific to a physical vapor deposition (PVD) system, that aspects of the disclosed plasma processing systems described herein may by applied to any type of processing system that utilizes a plasma. For example, the disclosed aspects may be applied to PVD systems, chemical vapor deposition (CVD) systems, or plasma etching systems.

The plurality of side electromagnets 202a, . . . , 202e are connected to a power supply 210. The plurality of side electromagnets are configured to generate separate magnetic fields 204a, . . . , 204e when a power supply 210 provides a current that flows through the side electromagnets. The separate magnetic fields 204a, . . . , 204e emanate from different locations around the workpiece 104 and control the distribution of plasma 110 within the processing chamber 102. For example, the separate magnetic fields 204a, . . . , 204e can be configured to change the distribution of a plasma 110 along a workpiece edge, thereby improving deposition (or etch) uniformity, asymmetry, and/or step-coverage. In some embodiments, the separate magnetic fields 204a, . . . , 204e may be superimposed upon one another, thereby contributing to the formation of an overall magnetic field that operates upon the plasma 110 within the processing chamber 102 to control distribution of the plasma 110.

In some embodiments, the plurality of side electromagnets 202 are located at positions that are vertically between a target 208 and a workpiece 104. The positions allow for the side electromagnets 202 to form an overall magnetic field that can operate upon a plasma 110 located between the target 208 and the workpiece 104. In some embodiments, the plurality of side electromagnets 202 are positioned on a first horizontal plane 206, extending through the plasma 110, which is parallel to the plane of the workpiece 104. In another embodiments, the plurality of side electromagnets 202 are positioned at different heights relative to the plane of the workpiece 104.

The size of each of the plurality of side electromagnets 202 is independent of the size of the workpiece 104. This allows for respective side electromagnets 202 to be kept relatively small. By keeping the size of the side electromagnets 202 small, they can have a relatively low resistance that does not increase as the size (i.e., diameter) of the workpiece 104 increases. The relatively low resistance allows for the power supply 210 to provide a current to each side electromagnet that generates a relatively high maximum magnetic field strength even at large workpiece sizes (e.g., 450 mm).

For example, in some embodiments, each of the side electromagnets 202 may comprise a winding of electrically conducting wire having a small size (e.g., half the diameter of the workpiece) that is independent of the size of the workpiece 104. The small size of the winding may be formed by a short length of electrically conducting wire, thereby providing for a coil having a relatively low resistance. The relatively low resistance allows for the power supply 210 to run a current through a coil to generate a relatively large magnetic field without causing thermal burn out. In other words, even as workpiece sizes increase the use of multiple side electromagnets 202 comprising a short length of electrically conducting wire allows for the power supply 210 to provide an increased maximum current to each side electromagnet, thereby increasing the maximum magnetic field strength generated by the side electromagnets 202.

In various embodiments, the side electromagnets 202 may comprise a winding of electrically conducting wire having a variety of shapes. For example, in some embodiments, the winding of electrically conducting wire may comprise a solenoid shape. In such an embodiment, the small size of the winding comprises a relatively small diameter of the solenoid. In other embodiments, the winding of electrically conducting wire may comprise another shape such as a toroid shape, for example.

In some embodiments, the processing chamber 102 comprises a Faraday shield 212 configured between the plasma 110 and the plurality of side electromagnets 202. The Faraday shield 212 is configured to prevent target material atoms 214 from depositing on the side electromagnets 202a . . . 202e. In additional embodiments, the processing chamber 102 may further comprise a cover ring 216, and a deposition ring 218 disposed over a portion of the workpiece support structure 106. During processing, the cover ring 216 and deposition ring 218 confine the plasma 110 to a region of the processing chamber 102 that is above the workpiece 104.

Figure 2B:
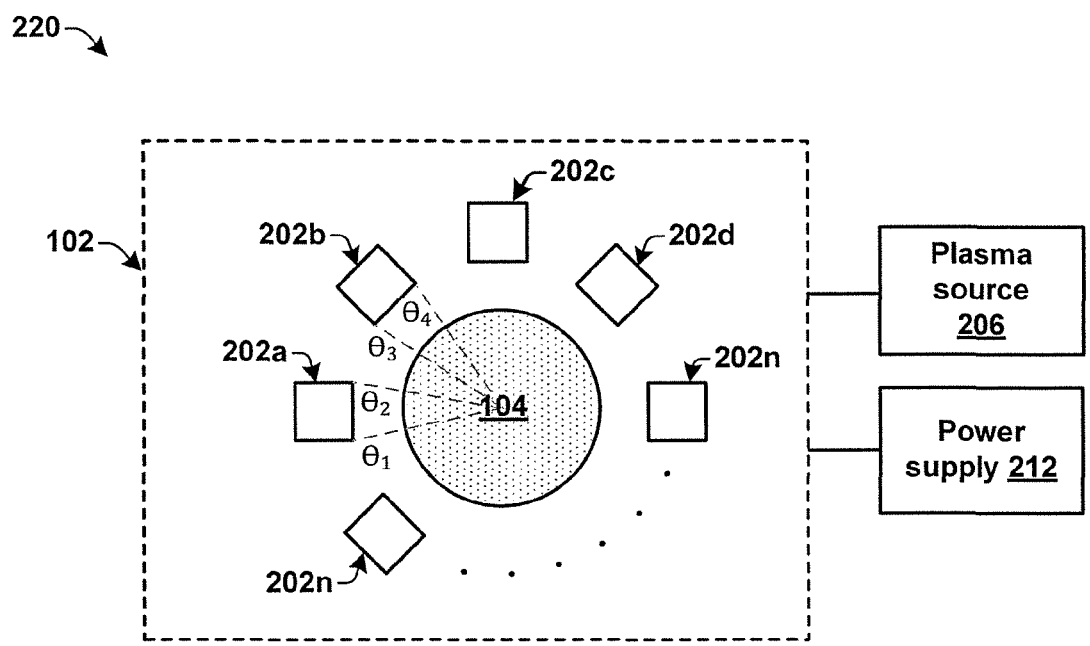
FIG. 2b illustrates a top view of some embodiments of a plasma processing system having a plurality of side electromagnets positioned around a workpiece.

FIG. 2b illustrates a top view 220 of some embodiments of an array of side electromagnets positioned around a workpiece 104.

As shown in FIG. 2b, the side electromagnets 202 are located at distinct angular positions around a perimeter of the workpiece 104. For example, a first side electromagnet 202a is positioned at a first angular position (extending from $\theta_1$ to $\theta_2$), while a second side electromagnet 202b is positioned at a second, different angular position (extending from $\theta_3$ to $\theta_4$). In some embodiments, the plurality of side electromagnets 202 are positioned symmetrically around the workpiece 104. For example, the plurality of side electromagnets 202 may be positioned at 10° intervals around the 360° degree circumference of the workpiece 104.

In some embodiments, the plurality of side electromagnets 202 comprise a plurality of coherent side electromagnets configured to generate separate magnetic fields having a same polarity. For example, side electromagnets 202a, . . . , 202n may be configured to generate separate magnetic fields extending inward towards the workpiece 104 along an axis that is perpendicular to the perimeter of the workpiece 104. The use of coherent side electromagnets allows for the side electromagnets 202a, . . . , 202n to generate separate magnetic fields that constructively interfere with one another to increase the strength of the overall magnetic field.

The number of side electromagnets 202 positioned around the workpiece 104 may vary in different embodiments. By varying the number of side electromagnets 202 the maximum overall magnetic field strength can be increased. This allows for the maximum magnetic field strength to be made invariant with respect to the workpiece size. In some embodiments, a number of side electromagnets 202 can be selected such that the maximum field strength can be increased as workpiece sizes increase.

FIGS. 3a and 3b illustrate cross-sectional views of wire coils 300 and 306 configured to generate magnetic fields 304. Wire coils 300 and 306 comprise a plurality of turns of electrically conductive wire 302 configured to carry a current.

When the current is passed through the electrically conductive wire 302, it generates a magnetic field 304 proportional to the current (i.e., $B=\mu_0 n i$, where B is the magnetic field, $\mu_0$ is the is the permeability of free space ($4 \cdot \pi \cdot 10^{-7}$ V·s/(A·m)), n is the number of turns of the wire, and i is the current passed through the wire).

Each coil has an average radius of $r_x$ and a length of wire approximately equal to the circumference of the coil multiplied by the number of turns (i.e., $l_{wire}=2 \cdot \pi \cdot r_x \cdot n$). One of ordinary skill in the art will appreciate that the resistance of a wire (R) is equal to the resistivity of a wire ($\rho$) multiplied by its length ($l_{wire}$) and divided by the radius of the wire ($r_{wire}$) (i.e., $R=\rho \cdot (l_{wire}/r_{wire})$). Since the length of a wire is equal to the circumference multiplied by the number of turns, the resistance of the wire is proportional to the radius of the magnetic coil (i.e., resistance, $R=\rho \cdot (n \cdot 2 \cdot \pi \cdot r_x/r_{wire})$). As shown in FIG. 3a, the average radius of wire coil 300 is $r_1$, resulting in a resistance of $R=\rho \cdot n \cdot 2 \cdot \pi \cdot r_1/r_{wire}$. As shown in FIG. 3b, average radius of wire coil 306 is $r_2<r_1$, resulting in a resistance of $R=\rho \cdot n \cdot 2 \cdot \pi \cdot r_2/r_{wire}$. Since $r_2$ is less than $r_1$, if the same number of turns n are used for each wire coil, the resistance of wire coil 306 is less than the resistance of wire coil 300.

Since power (P) is proportional to the resistance (R) multiplied by current square ($i^2$) (i.e., $P=i^2 R$), an increase in the resistance of a wire causes an increase in the power dissipated at same current. Accordingly, a wire coil having a smaller radius (e.g., $r_2$) with a larger current will dissipate the same amount of power as a wire coil having a larger radius (e.g., $r_1$) with a smaller current. Therefore, the smaller coil can prevent burn out of the conductive wire 302, by limiting the dissipated power (and thermal energy) at a current value that generates a large magnetic field.

In various embodiments, the side electromagnets can be arranged to have different orientations relative to a workpiece. For example, FIG. 4a. illustrates a top view of some embodiments of an array 400 of side electromagnets 402 having a first orientation relative to a workpiece 104.

As shown in FIG. 4a, side electromagnets 402 are oriented to have axes 406 that are perpendicular to the perimeter of the workpiece 104. Since the side electromagnets 402 are composed of a wire that wraps around axes 406, current flows through the side electromagnets in a direction that is substantially tangent to the perimeter of the workpiece 104. Because a magnetic field is generated in a direction that is perpendicular to a direction of a current, the side electromagnets 402 generate magnetic fields 404 along the axes 406 (i.e., which is perpendicular to the perimeter of a workpiece 104).

It will be appreciated that by controlling the direction of current through the side electromagnets 402, the side electromagnets 402 can be operated to generate a magnetic field along their axes having a direction that is radially inward or a direction that is radially outward. For example, as shown in FIG. 4b, the direction of the current within a side electromagnet will control the direction of the magnetic field generated by the side electromagnet. When current is provided to side electromagnet 408 in a first direction (into the page at 410a and out of the page at 410b) a magnetic field 412 having a first magnetic orientation will result. Alternatively, when current is provided to side electromagnet 414 in a second direction, opposite the first direction (into the page at 416b and out of the page at 416a) a magnetic field 418 having a second magnetic orientation opposite the first orientation will result.

If the direction of the current flow is chosen to generate a magnetic field that is radially inward, the side electromagnets 402 will have a north pole (N) located at the inward edge of the coil and a south pole located at the outer edge of the coil. If the direction of the current flow is chosen to generate a magnetic field that is radially outward, the side electromagnets 402 will have a north pole located at the outer edge of the coil and a south pole located at the inner edge of the coil.

FIG. 4c illustrates a graph 420 of an overall magnetic field strength (y-axis) generated by the array of side electromagnet coils illustrated in FIG. 4a as a function of workpiece size (x-axis). As illustrated in graph 420, the maximum magnetic field strength remains constant by increasing the number of side electromagnets 402 in the array. For example for a 150 mm workpiece, a single side electromagnet coil will result in a maximum magnetic field having a strength of $4.41 \times 10^{-2}$ T. The same maximum magnetic field strength can be achieved for a 300 mm workpiece using two side electromagnet coils and for a 450 mm workpiece using three side electromagnet coils. Therefore, the electromagnet array of FIG. 4a allows for a maximum magnetic field to remain constant independent of workpiece size by adding additional side electromagnets. This prevents the maximum magnetic field strength from degrading with increases in the workpiece size.

Figure 5A:
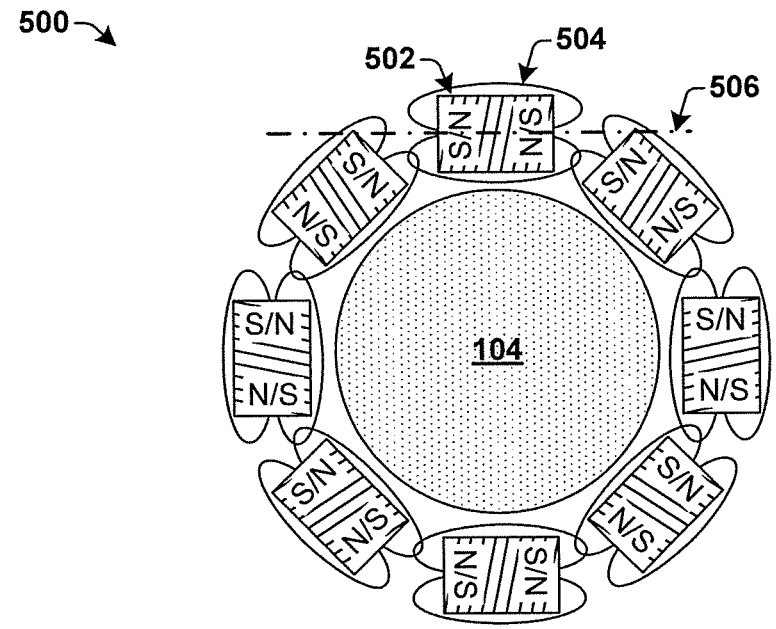
FIG. 5a illustrates a top view of some embodiments of an array of side electromagnets having a second exemplary orientation relative to the workpiece.
Figure 5B:
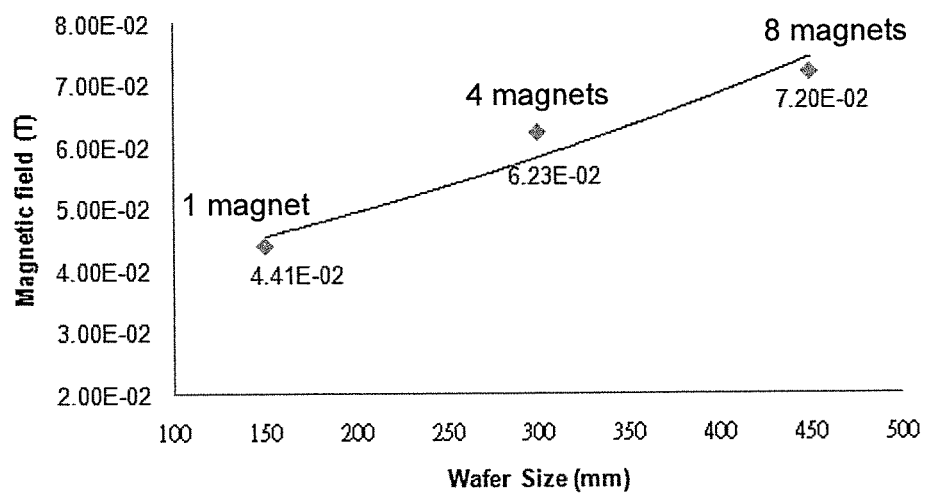
FIG. 5b illustrates a graph of the magnetic field strength generated by the array of side electromagnets in FIG. 5a as a function workpiece size.

FIG. 5a. illustrates a top view of some alternative embodiments of an array 500 of side electromagnets 502 having a second exemplary orientation relative to a workpiece 104.

As shown in FIG. 5a, the side electromagnets 502 are oriented to have axes 506 that are tangent to the perimeter of the workpiece 104. Since the side electromagnets 502 are composed of a wire that wraps around axes 506, current flows through the coil in a direction that is substantially perpendicular to the perimeter of the workpiece 104. Because a magnetic field is generated in a direction that is perpendicular to a direction of a current, the side electromagnets 502 generate magnetic fields 504 along the axes 506 (i.e., which is tangent to the perimeter of a workpiece 104). It will be appreciated that the side electromagnets 502 can be operated to generate a magnetic field along either direction of the axis, as discussed above in more detail.

FIG. 5c illustrates a graph 508 of the overall magnetic field strength (y-axis) generated by the array of side electromagnet coils illustrated in FIG. 5a as a function of workpiece size (x-axis). As illustrated in graph 508, the maximum magnetic field strength increase as the number of side electromagnets 502 in the array increases. For example for a 150 mm wafer, a single side electromagnets will result in a maximum magnetic field having a strength of $4.41 \times 10^{-2}$ T. For a 300 mm wafer, four side electromagnets will result in a maximum magnetic field having a strength of $6.23 \times 10^{-2}$ T and for a 450 mm wafer, eight side electromagnets will result in a maximum magnetic field having a strength of $7.20 \times 10^{-2}$ T. Therefore, the electromagnet array of FIG. 5a allows for the magnetic field to increase independent of workpiece size by adding additional side electromagnet coils.

In various embodiments, the separate side electromagnets can be controlled by the same control signals or by different control signals. For example, FIG. 6 illustrates a top view 600 of some embodiments of an array of side electromagnets 202a . . . 202n configured to receive a common control signal $S_{CTRL}$.

Figure 6:
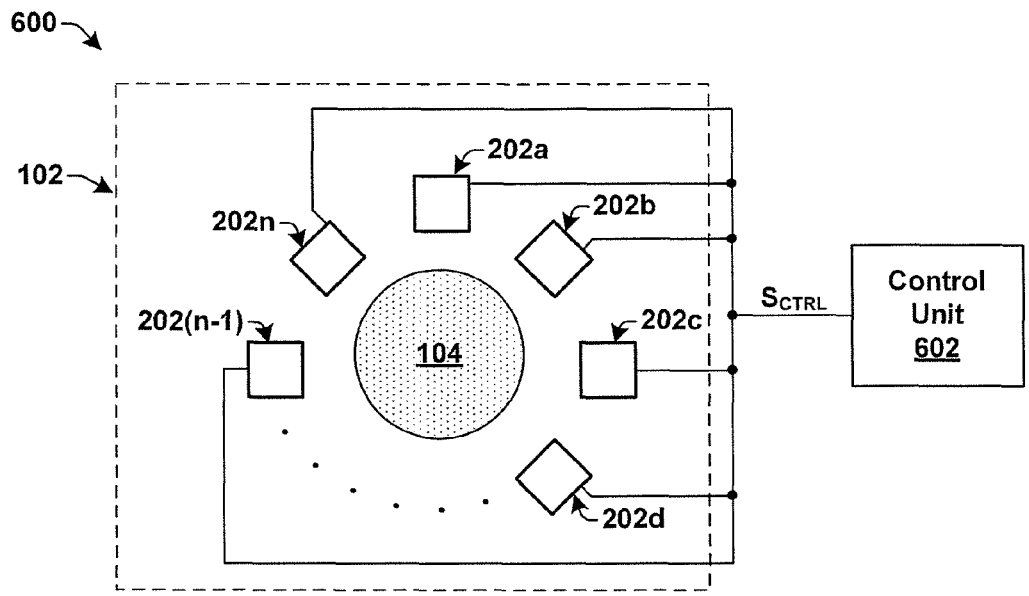
FIG. 6 illustrates a block diagram of some embodiments of an array of side electromagnets configured to receive a common control signal.

As illustrated in FIG. 6, the plurality of side electromagnets 202a . . . 202n are connected to a control unit 602 at a single input node. Since each of the side electromagnets 202a . . . 202n is connected in parallel, the effective resistance of seen by the control unit 602 is reduced over that a single ring type side electromagnet extending around the perimeter of the workpiece 104.

The control unit 602 is configured to output a common control signal $S_{CTRL}$, which is provided to each of the side electromagnets 202a . . . 202n. The common control signal $S_{CTRL}$ operates each of the side electromagnets 202a . . . 202n to generate a magnetic field having a same field strength (assuming that the side electromagnets have a same resistance), resulting in a symmetric overall magnetic field within the processing chamber 102. In some embodiments, the common control signal $S_{CTRL}$ comprises a current.

Figure 7A:
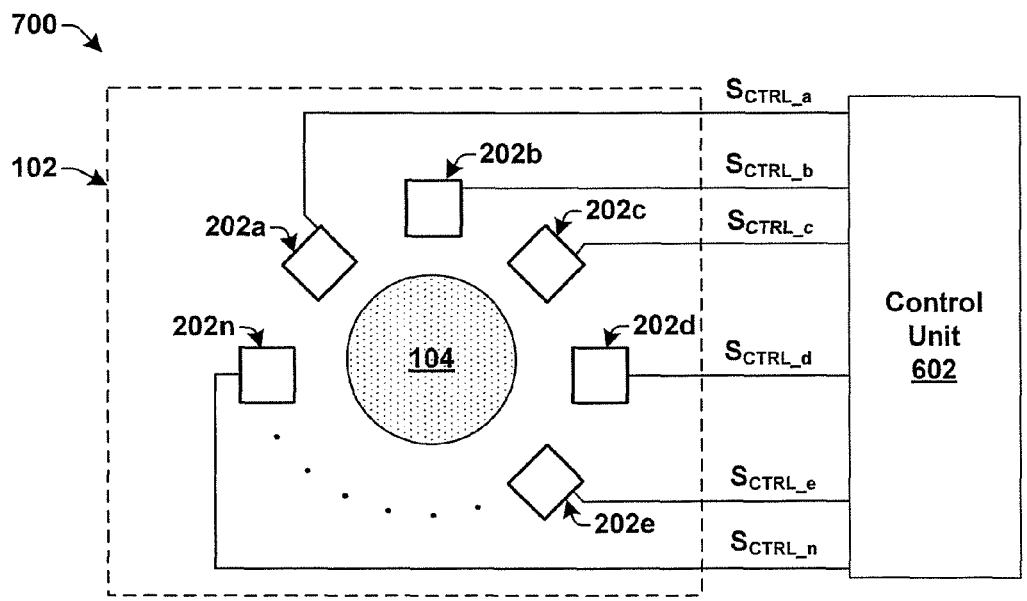
FIG. 7a illustrates a top view of some embodiments of an array of side electromagnets configured to receive independent control signals.

FIG. 7a illustrates a top view 700 of some embodiments of an array of independently controlled side electromagnets 202a . . . 202n configured to receive separate control signals $S_{CTRL\_a} \cdots S_{CTRL\_n}$.

As illustrated in FIG. 7a, the plurality of side electromagnets 202a . . . 202n are connected to a control unit 702 by separate conductive paths. The control unit 702 is configured to provide separate control signal $S_{CTRL\_a} \cdots S_{CTRL\_n}$ to each of the side electromagnets 202a . . . 202n. The separate control signals $S_{CTRL\_a} \cdots S_{CTRL\_n}$ allow for the separate side electromagnets 202a . . . 202n to be operated independent of one another, so that each side electromagnet can be operated to receive a control signal with a same value or with different values.

In some embodiments, the separate control signal $S_{CTRL\_a} \cdots S_{CTRL\_n}$ comprise currents. By providing equal current values to each of the side electromagnets 202a . . . 202n, a symmetric magnetic field is generated within the processing chamber 102. By providing a first current $I_1$ to a first side electromagnet 202a and a second current $I_2 > I_1$ to a second side electromagnetic 202b, the overall magnetic field is changed to an asymmetric magnetic field. This is because the magnetic field contribution of the second side electromagnetic 202b is greater than that of the first side electromagnet 202a, resulting in an asymmetric magnetic field within the processing chamber 102.

Figure 7B:
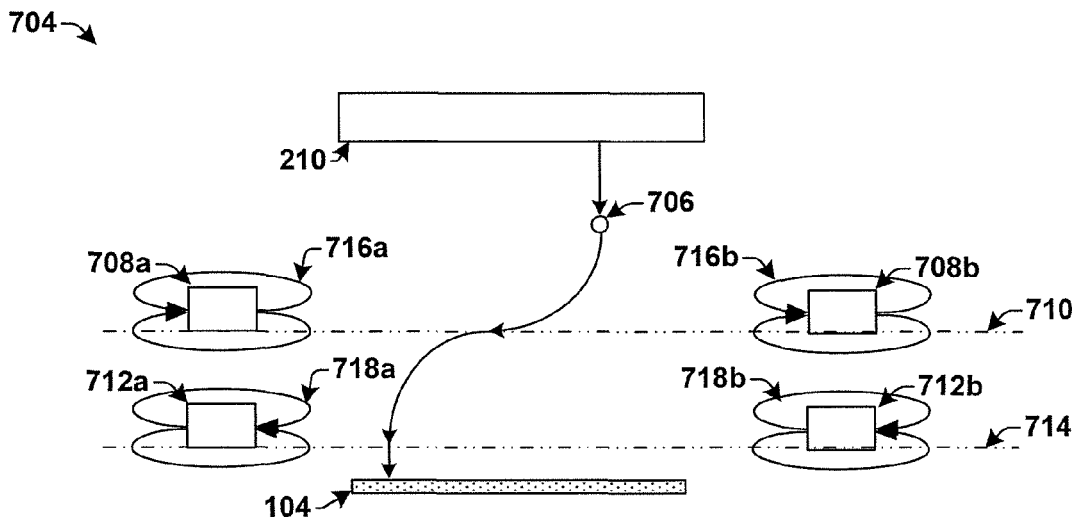

The use of separate control signals for separate side electromagnets 202 allows for the generation of an asymmetric magnetic field that provides tuning of plasma processing within the processing chamber 102. For example, FIG. 7b illustrates a side view of a trajectory a charged particle 706 (e.g., an ion) in a processing chamber configuration 704 according to the electromagnetic array of FIG. 7a.

The processing chamber configuration 704 comprises a first array of side electromagnets 708 positioned on the first horizontal plane 710, and a second first array of side electromagnets 712 positioned on the second horizontal plane 714, wherein the second horizontal plane 714 is parallel to and vertically above the first horizontal plane 710.

As the charged particle 706 travels from a target 208 towards a workpiece 104, it is subjected to forces due to the magnetic field generated by the side electromagnets 708a, 708b, 712a, and 712b. The magnetic fields can be adjusted to vary the position at which the charged particle 706 lands on the workpiece 104. For example, in one embodiment, a first side electromagnet 708b is operated to generate a magnetic field 716b having a first polarity. The magnetic field 716b operates upon the charged particle 706 with a force that changes the trajectory of the charged particle 706 by pushing the charged particle 706 away from the side electromagnet 708b. A second side electromagnet 712a is also operated to generate a magnetic field 718a having the first polarity. The magnetic field 718a operates upon the charged particle 706 with a force that changes the trajectory of the charged particle 706 by pushing the charged particle 706 away from the side electromagnet 712a.

In alternative embodiments, one or more side electromagnets can be operated to generate a magnetic field having a second polarity (e.g., illustrated as side electromagnets 708a and 712b and fields 716a and 718b, respectively). The magnetic field operates upon the charged particle 706 with a force that changes the trajectory of the charged particle 706 by pulling the charged particle 706 towards the side electromagnets. Accordingly, by changing a magnetic field distribution, particle trajectories and therefore the rate thin film deposition along some parts of a workpiece edge can be changed without changing it along other parts of the workpiece edge.

Figure 8:
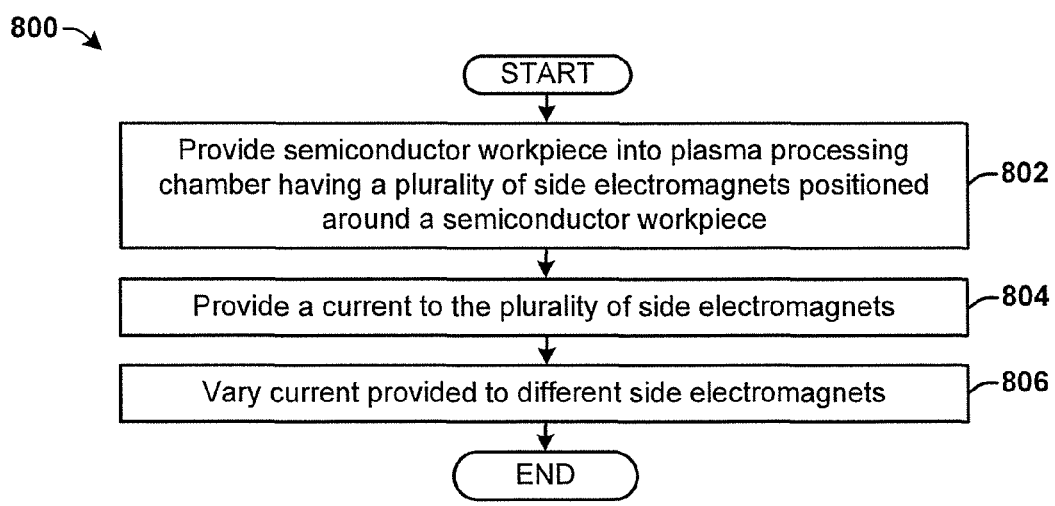
FIG. 8 illustrates a flow diagram of some embodiments of a method for forming a magnetic field for plasma processing having a field strength that is independent of workpiece size.

FIG. 8 illustrates a flow diagram of some embodiments of a method 800 for forming a magnetic field for plasma processing having a field strength that is independent of workpiece size. While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 802 a semiconductor workpiece is provided into a plasma processing chamber having a plurality of side electromagnets positioned around a semiconductor workpiece. In some embodiments, the plurality of side electromagnets comprise coherent side electromagnets configured to generate separate magnetic fields having a same polarity.

At step 804 a current is provided to the plurality of side electromagnets. The flow of current through the plurality of side electromagnets generates separate magnetic fields that emanate from different positions around the workpiece. The separate magnetic fields may contribute to the formation of an overall magnetic field configured to control the distribution of a plasma within the processing chamber.

At step 806 the current provided to different side electromagnets is varied. By varying the current provided to the different side electromagnets, the distribution of the magnetic field within the processing chamber can be changed to tune plasma processing.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a plasma processing system having a plurality of side electromagnets configured to generate a magnetic field having a maximum magnetic field strength that is independent of workpiece size.

In some embodiments, the present disclosure relates to a plasma processing system, comprising a processing chamber configured to house a semiconductor workpiece. A plurality of side electromagnets are positioned around a perimeter of the semiconductor workpiece and have sizes that are independent of a workpiece size. A power supply is configured to pass current through the plurality of side electromagnets, which causes respective side electromagnets to generate separate magnetic fields that emanate from different positions around the workpiece and that control the distribution of a plasma within the processing chamber.

In another embodiment, the present disclosure relates to a plasma processing system comprising a processing chamber configured to house a semiconductor workpiece. A plasma source is configured to provide a plasma within the processing chamber and a plurality of side electromagnets are positioned around a perimeter of the workpiece. The plurality of side electromagnets are configured to generate separate magnetic fields that contribute to the formation of an overall magnetic field having a maximum magnetic field strength that is independent of the size of the workpiece. The overall magnetic field operates upon the plasma to adjust plasma distribution within the processing chamber.

In another embodiment, the present disclosure relates to a method of forming a magnetic field for plasma processing having a field strength that is independent of workpiece size, comprising. The method comprises providing a semiconductor workpiece into a plasma processing chamber having a plurality of side electromagnets positioned around a semiconductor. The method further comprises providing a current to the plurality of side electromagnets, wherein the flow of current through the plurality of side electromagnets generates separate magnetic fields that emanate from different positions around the workpiece, and which contribute to the formation of an overall magnetic field configured to control the distribution of a plasma within the processing chamber

What is claimed is:

1. A plasma processing system, comprising:
   a processing chamber configured to house a semiconductor workpiece;
   a plurality of side electromagnets positioned around a perimeter of the semiconductor workpiece and having sizes that are independent of a workpiece size;
   a power supply configured to pass current through the plurality of side electromagnets, which causes respective side electromagnets to generate separate magnetic fields that emanate from different positions around the semiconductor workpiece and that control distribution of a plasma within the processing chamber; and
   wherein said plurality of side electromagnets are oriented to have magnetic poles extending along an axis that is perpendicular to a radius of the semiconductor workpiece.

2. The plasma processing system of claim 1, wherein the plurality of side electromagnets comprise coherent side electromagnets configured to generate separate magnetic fields having a same polarity.

3. The plasma processing system of claim 1, wherein the plurality side electromagnets are located at distinct angular positions around the perimeter of the semiconductor workpiece.

4. The plasma processing system of claim 1, wherein the separate magnetic fields are superimposed upon on another to form a maximum magnetic field strength that is a function of a number of the plurality of side electromagnets and that is independent of the size of the semiconductor workpiece.

5. A plasma processing system, comprising:
   a processing chamber configured to house a semiconductor workpiece;
   a plasma source configured to provide a plasma within the processing chamber; and
   a plurality of side electromagnets positioned around a perimeter of the semiconductor workpiece and configured to generate separate magnetic fields that contribute to the formation of an overall magnetic field having a maximum magnetic field strength that is independent of a size of the semiconductor workpiece, wherein the plurality of side electromagnets have magnetic poles extending along an axis that is perpendicular to a radius of the semiconductor workpiece;
   wherein the overall magnetic field operates upon the plasma to adjust plasma distribution within the processing chamber.

6. The plasma processing system of claim 5, wherein the plurality of side electromagnets comprise coherent side electromagnets configured to generate separate magnetic fields having a same polarity.

7. The plasma processing system of claim 5, wherein the magnetic poles of the plurality of side electromagnets are oriented to extend along a tangent of the perimeter of the semiconductor workpiece.

8. The plasma processing system of claim 5,
   wherein one or more of the plurality of side electromagnets are positioned on a first horizontal plane parallel to the semiconductor workpiece, and
   wherein one or more of the plurality of side electromagnets are positioned on a second horizontal plane vertically above and parallel to the first horizontal plane.

9. The plasma processing system of claim 5, further comprising a control unit configured to provide a control signal to the plurality of side electromagnets which controls generation of the separate magnetic fields.

10. The plasma processing system of claim 9, wherein the control unit is configured to provide a common control signal to each of the plurality of side electromagnets.

11. The plasma processing system of claim 9, wherein the control unit is configured to provide different control signals to at least two of the plurality of side electromagnets to enable tuning of a distribution of the overall magnetic field.

12. A method of forming a magnetic field for plasma processing having a field strength that is independent of workpiece size, comprising:
   providing a semiconductor workpiece into a plasma processing chamber having a plurality of side electromagnets positioned around the semiconductor workpiece;
   providing a current to the plurality of side electromagnets, wherein a flow of current through the plurality of side electromagnets generates separate magnetic fields that emanate from different positions around the semiconductor workpiece, and which contribute to the formation of an overall magnetic field configured to control distribution of a plasma within the processing chamber; and
   wherein the plurality of side electromagnets are oriented to have magnetic poles extending along an axis that is perpendicular to a radius of the semiconductor workpiece.

13. The method of claim 12, further comprising varying values of the current provided to at least two of the plurality of side electromagnets to enable tuning of a distribution of the overall magnetic field.

14. The method of claim 12, wherein the plurality side electromagnets are located at distinct angular positions around a perimeter of the semiconductor workpiece.

15. The plasma processing system of claim 1, wherein the power supply is separately connected to respective side electromagnets of the plurality of side electromagnets.

16. The plasma processing system of claim 1, wherein the magnetic poles of the plurality of side electromagnets are oriented to extend along a tangent of the perimeter of the semiconductor workpiece.

17. The method of claim 12, wherein the magnetic poles of the plurality of side electromagnets are oriented to extend along a tangent of a perimeter of the semiconductor workpiece.

* * * * *